US009531390B1

(12) United States Patent
Choi et al.

(10) Patent No.: US 9,531,390 B1
(45) Date of Patent: Dec. 27, 2016

(54) TECHNIQUES FOR GENERATING CLOCK SIGNALS USING OSCILLATORS

(71) Applicant: Altera Corporation, San Jose, CA (US)

(72) Inventors: Dong-Myung Choi, San Jose, CA (US); David Mendel, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/969,348

(22) Filed: Dec. 15, 2015

(51) Int. Cl.
*H03C 1/02* (2006.01)
*H03L 7/07* (2006.01)
*H03L 7/08* (2006.01)
*H03B 5/08* (2006.01)
*H03L 7/099* (2006.01)
*H04B 1/16* (2006.01)
*H03K 5/13* (2014.01)
*H03K 3/03* (2006.01)

(52) U.S. Cl.
CPC . *H03L 7/07* (2013.01); *H03B 5/08* (2013.01); *H03L 7/0805* (2013.01); *H03L 7/0995* (2013.01); *H04B 1/16* (2013.01); *H03K 3/0315* (2013.01); *H03K 5/131* (2013.01)

(58) Field of Classification Search
CPC ........ H03K 5/131; H03K 3/0315; H04B 1/16; H03L 7/07; H03L 7/0805; H03L 7/0995; H03B 5/08
USPC ........ 375/376, 307, 299, 295; 455/260, 269; 332/159, 144; 331/18, 2, 46, 57; 327/156
See application file for complete search history.

(56) References Cited

U.S. PATENT DOCUMENTS

2006/0001494 A1 1/2006 Garlepp et al.
2008/0043818 A1* 2/2008 Tal ........................... H03C 3/40
375/135

OTHER PUBLICATIONS

"Arria 10 Transceiver PHY User Guide," Altera Corporation, May 11, 2015, pp. 1-626.
"Arria 10 Transceiver PHY User Guide," Altera Corporation, Dec. 2, 2013, p. 1-432.
Ahmad Mirzaei et al., "A Pulling Mitigation Technique for Direct-Conversion Transmitters," 2014 IEEE International Solid-State Circuits Conference, Session 21, Frequency Generation Techniques, 21.8, pp. 374-376.

* cited by examiner

*Primary Examiner* — Arnold Kinkead
(74) *Attorney, Agent, or Firm* — Steven J. Cahill

(57) ABSTRACT

An integrated circuit includes first and second data channel circuits and first and second inductor-capacitor (LC) tank oscillator circuits. The first data channel circuit generates a first data signal in response to a first clock signal. The second data channel circuit generates a second data signal in response to a second clock signal. The frequencies of the first and second clock signals are substantially the same. The first LC tank oscillator circuit generates a first periodic signal. The first clock signal is generated in response to the first periodic signal. The second LC tank oscillator circuit generates a second periodic signal. The second clock signal is generated in response to the second periodic signal. The first and second LC tank oscillator circuits generate non-overlapping frequency ranges for the first and second periodic signals.

20 Claims, 5 Drawing Sheets

TECHNIQUES FOR GENERATING CLOCK SIGNALS USING OSCILLATORS

FIELD OF THE DISCLOSURE

The present disclosure relates to electronic circuits, and more particularly, to techniques for generating clock signals using oscillators.

BACKGROUND

A phase-locked loop (PLL) is an electronic circuit that adjusts the frequency of a feedback clock signal based on the frequency of a reference clock signal. Phase-locked loops (PLLs) generate periodic clock signals for data recovery, data transfer, and other clocking functions in integrated circuits. PLLs often supply a clock signal generated by an oscillator to one or more frequency dividers that divide the clock signal to a lower frequency clock signal for distribution around an integrated circuit or system.

BRIEF SUMMARY

According to some embodiments, an integrated circuit includes first and second data channel circuits and first and second inductor-capacitor (LC) tank oscillator circuits. The first data channel circuit generates a first data signal in response to a first clock signal. The second data channel circuit generates a second data signal in response to a second clock signal. The frequencies of the first and second clock signals are substantially the same. The first LC tank oscillator circuit generates a first periodic signal. The first clock signal is generated in response to the first periodic signal. The second LC tank oscillator circuit generates a second periodic signal. The second clock signal is generated in response to the second periodic signal. The first and second LC tank oscillator circuits generate non-overlapping frequency ranges for the first and second periodic signals, for example, to reduce electro-magnetic (EM) coupling.

Various objects, features, and advantages of the present invention will become apparent upon consideration of the following detailed description and the accompanying drawings.

DETAILED DESCRIPTION

Figure 1:
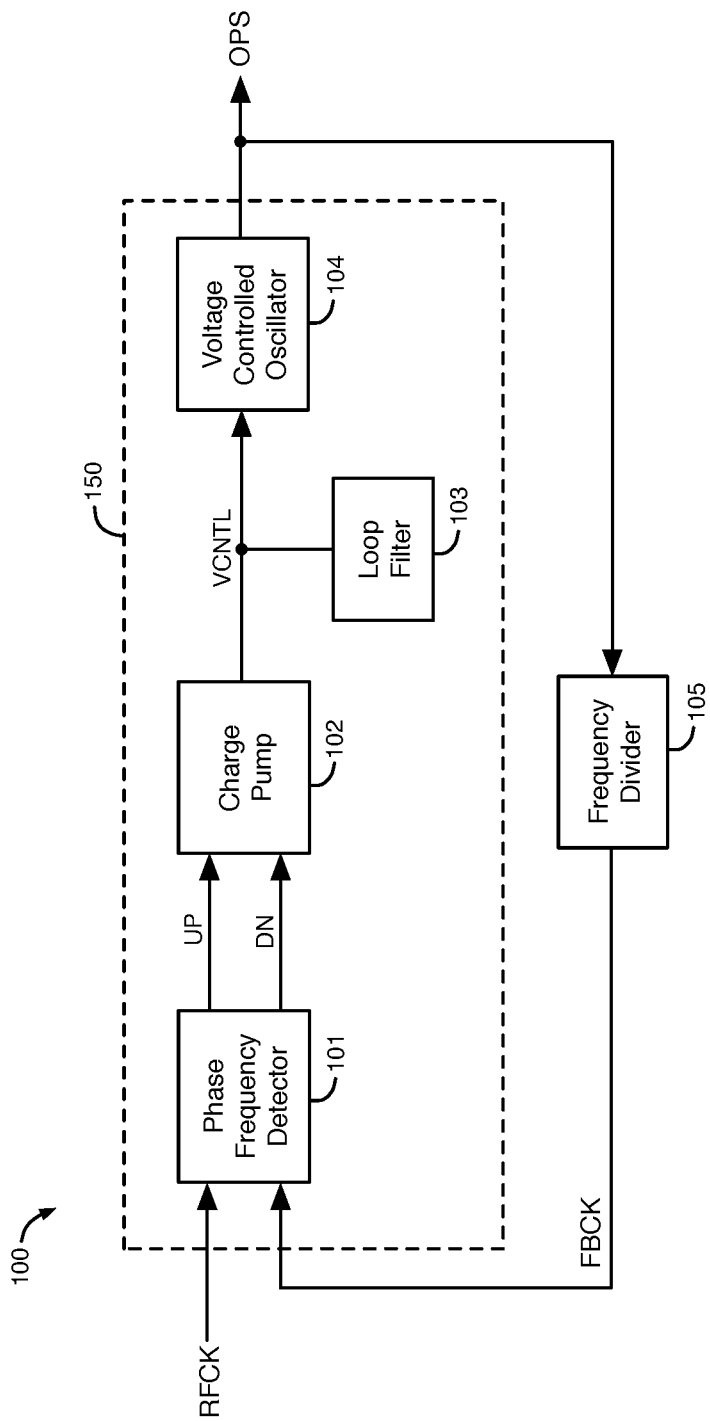
FIG. 1 illustrates an example of a phase-locked loop (PLL) circuit, according to an embodiment.

Many data communication protocols support the transmission of data through multiple data channel circuits in an integrated circuit (IC) that operate in parallel. Each of the data channel circuits may include a transmitter circuit that transmits data outside the integrated circuit to one or more external devices and/or a receiver circuit that receives data transmitted from one or more external devices outside the integrated circuit. The transmitter circuit in each data channel circuit transmits data in response to a clock signal. A clock signal is an oscillating periodic signal. The requirements of some data communication protocols necessitate that the transmitter circuit in each data channel circuit transmits data in response to a clock signal that is generated independently of the clock signals used by the transmitter circuits in the other data channel circuits that operate in parallel in the IC. The Optical Transport Network (OTN) standards and serial digital interface (SDI) standards include examples of such protocols.

Phase-locked loop circuits can generate clock signals. A phase-locked loop (PLL) circuit typically includes an oscillator circuit that generates one or more oscillating periodic signals. There are multiple different types of oscillator circuits that can be used in PLL circuits. Two types of oscillator circuits that are often used in PLL circuits are ring oscillator circuits and inductor-capacitor (LC) tank oscillator circuits. LC tank oscillator circuits typically generate significantly less phase noise and phase jitter in their oscillating periodic signals than ring oscillator circuits at comparable frequencies. However, two or more PLL circuits that are nearby on an IC, that each have an LC tank oscillator circuit, and that are generating periodic signals at the same or nearly the same frequencies can generate significant electro-magnetic (EM) cross-coupling. The EM cross-coupling may cause a substantial amount of jitter in the output clock signals of each of the PLL circuits. The jitter caused by the EM cross-coupling may be large enough to cause the data channel circuits to transmit incorrect data. In some communication protocols, the transmitter circuits in multiple data channel circuits operating at the same time may transmit data signals at the same or nearly the same data rates. If these communication protocols necessitate that the data channel circuits use independently generated clock signals having the same frequencies, and the clock signal for each data channel circuit is generated by a separate PLL circuit having an LC tank oscillator circuit, the LC tank oscillator circuits may cause substantial jitter in the output clock signals of the PLL circuits, possibly causing failed data transmission.

According to some of the embodiments disclosed herein, an integrated circuit (IC) includes two or more data channel circuits and two or more LC tank oscillator circuits. Each of the data channel circuits includes a transmitter circuit that generates an output data signal based on an input data signal in response to a clock signal. The LC tank oscillator circuits may, for example, be in a set of PLL circuits. Each of the LC tank oscillator circuits generates a frequency range in its internally generated oscillating periodic signal that does not overlap with the frequency ranges of the oscillating periodic signals internally generated by the other nearby LC tank oscillator circuits to reduce EM coupling and its associated jitter. As a result, nearby LC tank oscillator circuits do not operate at the same frequency, and therefore, there is no significant EM coupling between LC tank oscillators that are physically separated by a minimum distance or less on the IC. The LC tank oscillator circuits that are physically separated by greater than the minimum distance on the IC can operate at the same frequency or in the same range of frequencies without generating significant EM coupling or jitter. The minimum distance may, for example, be the distance on the IC between a minimum number N of the LC tank oscillator circuits or a minimum number N of the data channel circuits. Each LC tank oscillator circuit does not need to support a wide frequency range. Instead, the frequency range that each LC tank oscillator circuit provides in its internally generated periodic signal may be relatively narrow. Additional circuitry generates clock signals having the same or substantially the same frequencies in response to the oscillating periodic signals that are internally generated by the LC tank oscillator circuits. The clock signals are used by the transmitter circuits to generate the output data signals. The additional circuitry may include, for example, a second set of PLL circuits or a set of frequency divider circuits.

FIG. 1 illustrates an example of a phase-locked loop circuit 100, according to an embodiment. In the embodiment of Figure (FIG. 1, phase-locked loop (PLL) circuit 100 includes phase frequency detector circuit 101, charge pump circuit 102, loop filter circuit 103, voltage-controlled oscillator circuit 104, and frequency divider circuit 105. PLL circuit 100 is in an integrated circuit. PLL circuit 100 is a clock signal generation circuit that generates one or more oscillating periodic signals OPS and a feedback clock signal FBCK in response to a reference clock signal RFCK. The phase frequency detector circuit 101, charge pump circuit 102, loop filter circuit 103, and voltage-controlled oscillator circuit 104 of PLL circuit 100 are also collectively referred to herein as circuitry 150 as shown by the dotted box in FIG. 1.

Reference clock signal RFCK is provided to a first input of phase frequency detector circuit 101. Feedback clock signal FBCK is provided to a second input of phase frequency detector circuit 101. Phase frequency detector circuit 101 compares the phase and the frequency of reference clock signal RFCK to the phase and the frequency of feedback clock signal FBCK to generate phase error signals UP and DN. In an embodiment, phase frequency detector circuit 101 generates pulses in phase error signals UP and DN that vary based on changes in the differences between the phases and/or frequencies of clock signals RFCK and FBCK. Phase error signals UP and DN are provided to inputs of charge pump circuit 102.

Charge pump circuit 102 generates an analog control voltage VCNTL at its output. Charge pump circuit 102 varies control voltage VCNTL based on changes in the UP and DN phase error signals. The control voltage VCNTL is low pass filtered by the loop filter circuit 103. According to an exemplary embodiment, charge pump circuit 102 sends charge to the loop filter circuit 103 in response to logic high pulses in the UP signal, and charge pump circuit 102 drains charge from the loop filter circuit 103 in response to logic high pulses in the DN signal.

The control voltage VCNTL as filtered by loop filter circuit 103 is provided to a control input of voltage-controlled oscillator (VCO) circuit 104. VCO circuit 104 generates oscillating periodic signals OPS. VCO circuit 104 varies the frequencies of periodic signals OPS in response to changes in control voltage VCNTL.

One or more of the periodic signals OPS of VCO circuit 104 are provided to inputs of frequency divider circuit 105. Frequency divider circuit 105 generates the feedback clock signal FBCK based on one or more of periodic signals OPS. Frequency divider circuit 105 causes the frequency of clock signal FBCK to equal the frequency of at least one of periodic signals OPS divided by a frequency division value. The frequency division value of frequency divider circuit 105 may be, for example, a positive integer or fractional number.

According to an exemplary embodiment, phase frequency detector circuit 101 generates logic high pulses in the UP signal that are longer than the logic high pulses in the DN signal when the frequency of reference clock signal RFCK is greater than the frequency of feedback clock signal FBCK. When logic high pulses in the UP signal are longer than logic high pulses in the DN signal, charge pump circuit 102 increases the control voltage VCNTL. In response to control voltage VCNTL increasing, VCO circuit 104 increases the frequencies of periodic signals OPS, which causes the frequency of clock signal FBCK to increase.

In this embodiment, phase frequency detector circuit 101 generates logic high pulses in the DN signal that are longer than the logic high pulses in the UP signal when the frequency of feedback clock signal FBCK is greater than the frequency of reference clock signal RFCK. When logic high pulses in the DN signal are longer than logic high pulses in the UP signal, charge pump circuit 102 decreases control voltage VCNTL. In response to control voltage VCNTL decreasing, VCO circuit 104 decreases the frequencies of periodic signals OPS, which causes the frequency of clock signal FBCK to decrease.

VCO circuit 104 varies the frequencies of periodic signals OPS based on changes in the control voltage VCNTL, until the reference clock signal RFCK and the feedback clock signal FBCK are phase aligned within a static phase offset of PLL 100. The static phase offset is an error margin of PLL 100. Clock signals RFCK and FBCK have the same or approximately the same frequency when the phases of clock signals RFCK and FBCK are aligned within the static phase offset over several periods.

Figure 2:
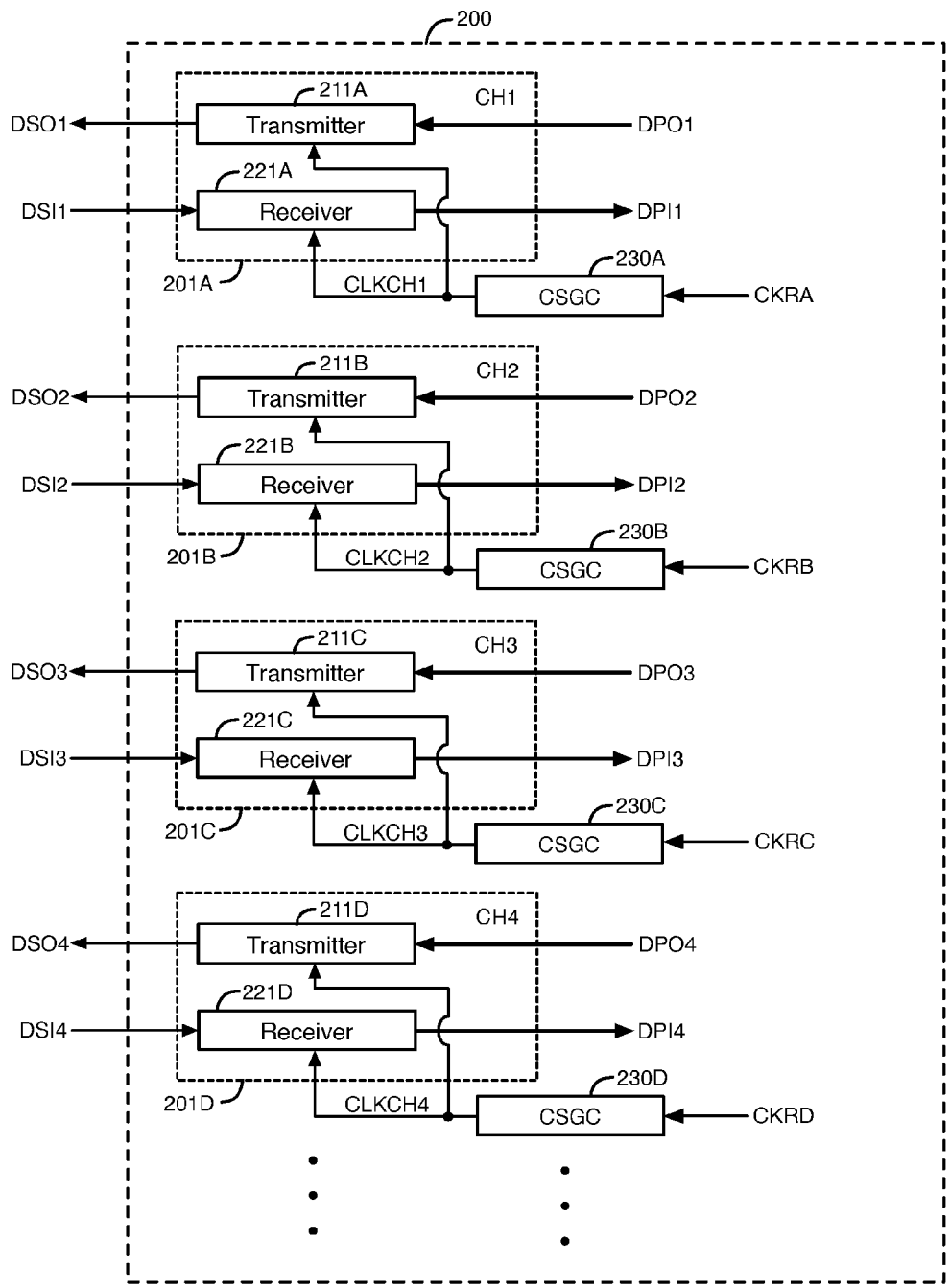
FIG. 2 illustrates an exemplary portion of an integrated circuit that includes data channel circuits and clock signal generation circuits, according to an embodiment.

FIG. 2 illustrates an exemplary portion of an integrated circuit 200 that includes data channel circuits 201 and clock signal generation circuits (CSGC) 230, according to an embodiment. FIG. 2 illustrates four data channel circuits 201A-201D (CH1-CH4) and four corresponding clock signal generation circuits 230A-230D as an example. Examples of clock signal generation circuits 230 are disclosed herein with respect to FIGS. 3-4. According to various embodiments, an integrated circuit (IC) may include any number of two, three, four, five, six, seven, eight, or more data channel circuits 201 and the same number of clock signal generation circuits 230. Each of the data channel circuits 201 includes a transmitter circuit 211 and a receiver circuit 221. For example, data channel circuits 201A-201D include transmitter circuits 211A-211D and receiver circuits 221A-221D, respectively, as shown in FIG. 2. In the embodiment of FIG. 2, data channel circuits 201 are transceivers. According to various embodiments, the data channel circuits may have only transmitters, only receivers, or any combination thereof.

IC 200 may be any type of integrated circuit such as a field programmable gate array (FPGA), a programmable logic device (PLD), a complex programmable logic device (CPLD), a programmable logic array (PLA), an application specific integrated circuit (ASIC), a memory integrated circuit, a central processing unit, a microprocessor, an analog integrated circuit, etc.

Each of the clock signal generation circuits 230 generates a clock signal that is provided to a respective one of the data channel circuits 201 in response to a reference clock signal. For example, clock signal generation circuits 230A-230D generate clock signals CLKCH1, CLKCH2, CLKCH3, and CLKCH4 in response to reference clock signals CKRA, CKRB, CKRC, and CKRD, respectively. Clock signals CLKCH1, CLKCH2, CLKCH3, and CLKCH4 are provided to data channel circuits 201A, 201B, 201C, and 201D, respectively, as shown in FIG. 2. In the embodiment of FIG. 2, clock signals CLKCH1, CLKCH2, and CLKCH4 are provided to the transmitter circuits 211A-211D and to the receiver circuits 221A-221D in the data channel circuits 201A-201D, respectively. Each of the clock signal generation circuits 230A-230D may, for example, include one or more PLL circuits.

In some embodiments, each of the reference clock signals CKRA, CKRB, CKRC, and CKRD has the same frequency. In these embodiments, reference clock signals CKRA-CKRD may be generated by a single clock source (e.g., a single PLL circuit) or by two, three or four clock sources (e.g., 2, 3, or 4 PLL circuits). In these embodiments, circuits 230A-230D may cause output clock signals CLKCH1-CLKCH4 to have nearly identical frequencies (e.g., using delta-sigma fractional multiplication as discussed below). In other embodiments, reference clock signals CKRA, CKRB, CKRC, and CKRD have two, three or four different frequencies and may be generated by one, two, three or four clock sources (e.g., 1, 2, 3 or 4 PLL circuits).

Integrated circuit (IC) 200 generates four sets of parallel data signals DPO1, DPO2, DPO3, and DPO4 that are provided to transmitter circuits 211A-211D, respectively. Transmitter circuits 211A-211D generate four output serial data signals DSO1, DSO2, DSO3, and DSO4 based on parallel data signals DPO1, DPO2, DPO3, and DPO4 in response to clock signals CLKCH1, CLKCH2, CLKCH3, and CLKCH4, respectively. Transmitter circuits 211A-211D provide the parallel data bits indicated by parallel data signals DPO1, DPO2, DPO3, and DPO4 to the serial data signals DSO1, DSO2, DSO3, and DSO4, respectively, as serial data bits. Each of the transmitter circuits 211A-211D may include a serializer circuit. Transmitter circuits 211A-211D transmit output serial data signals DSO1, DSO2, DSO3, and DSO4, respectively, from IC 200 to one or more external devices outside IC 200.

Integrated circuit 200 receives four input serial data signals DSI1, DSI2, DSI3, and DSI4 from one or more external devices. Serial data signals DSI1, DSI2, DSI3, and DSI4 are provided to inputs of receiver circuits 221A-221D, respectively. Receiver circuits 221A-221D generate four sets of parallel data signals DPI1, DPI2, DPI3, and DPI4 based on input serial data signals DSI1, DSI2, DSI3, and DSI4 in response to clock signals CLKCH1, CLKCH2, CLKCH3, and CLKCH4, respectively. Receiver circuits 221A-221D provide the serial data bits indicated by serial data signals DSI1, DSI2, DSI3, and DSI4 to the parallel data signals DPI1, DPI2, DPI3, and DPI4, respectively, as parallel data bits. Each of the receiver circuits 221A-221D may include a de-serializer circuit. The parallel data signals DPI1, DPI2, DPI3, and DPI4 are provided from receiver circuits 221A-221D, respectively, to other circuitry in IC 200 (e.g., a control circuit, programmable logic circuits, memory circuits, registers, etc.).

According to an alternative embodiment, the clock signals CLKCH1, CLKCH2, CLKCH3, and CLKCH4 generated by clock signal generation circuits 230A-230D are provided to transmitter circuits 211A-211D, respectively, but the clock signals CLKCH1, CLKCH2, CLKCH3, and CLKCH4 are not provided to receiver circuits 221A-221D. In this particular embodiment, receiver circuits 221A-221D do not generate parallel data signals DPI1, DPI2, DPI3, and DPI4 in response to clock signals CLKCH1, CLKCH2, CLKCH3, and CLKCH4, respectively.

Figure 3:
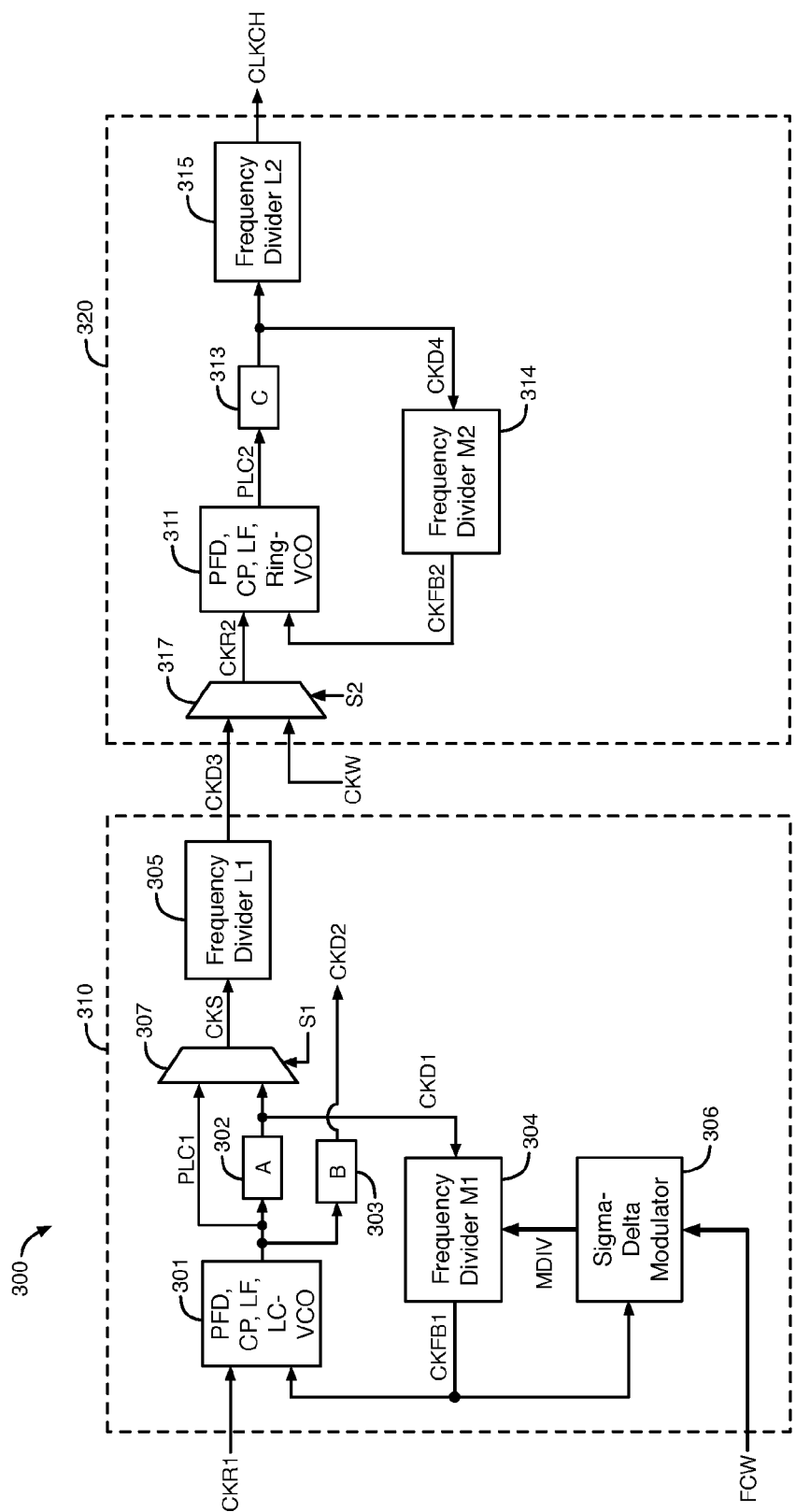
FIG. 3 illustrates an example of a clock signal generation circuit that includes two cascaded phase-locked loop circuits, according to an embodiment.

FIG. 3 illustrates an example of a clock signal generation circuit 300 that includes two cascaded phase-locked loop circuits 310 and 320, according to an embodiment. Clock signal generation circuit 300 shown in FIG. 3 is an example of each of the clock signal generation circuits 230A-230D of FIG. 2. In an embodiment, each of the 4 clock signal generation circuits 230A-230D of FIG. 2 includes an instance of clock signal generation circuit 300.

Clock signal generation circuit 300 includes cascaded phase-locked loop (PLL) circuits 310 and 320. PLL circuit 310 includes circuits 301, frequency divider circuits 302-305, sigma-delta modulator circuit 306, and multiplexer circuit 307. PLL circuit 320 includes circuits 311, frequency divider circuits 313-315, and multiplexer circuit 317. Circuitry 150 shown in FIG. 1 is an example of circuits 301 and an example of circuits 311. According to this example, circuits 301 include a phase frequency detector (PFD) circuit 101, a charge pump (CP) circuit 102, a loop filter (LF) circuit 103, and a voltage-controlled oscillator (VCO) circuit 104 that are coupled as shown in FIG. 1. In this example, circuits 311 also include a phase frequency detector (PFD) circuit 101, a charge pump (CP) circuit 102, a loop filter (LF) circuit 103, and a voltage-controlled oscillator (VCO) circuit 104 that are coupled as shown in FIG. 1. In an embodiment, the VCO circuit 104 in circuits 301 is an inductor-capacitor (LC) tank oscillator circuit, and the VCO circuit 104 in circuits 311 is a ring oscillator circuit. One example of an LC tank oscillator circuit that may be used in PLL circuit 310 is disclosed in FIG. 3 of commonly-assigned U.S. Pat. No. 7,602,260, issued Oct. 13, 2009, which is incorporated by reference herein in its entirety. The frequency divider circuits disclosed herein may be analog, digital (e.g., a counter circuit), mixed signal, or any combination thereof.

The operation of clock signal generation circuit 300 is now described in further detail. A reference clock signal CKR1 is provided to a first input of PFD circuit 101 in circuits 301, and a feedback clock signal CKFB1 is provided to a second input of PFD circuit 101 in circuits 301. The reference clock signal CKR1 may be any of the clock signals CKRA-CKRD in FIG. 2. The LC tank VCO circuit 104 in circuits 301 generates an oscillating periodic signal PLC1 (e.g., one of signals OPS in FIG. 1) based on the phase and/or frequency differences between the reference and feedback clock signals CKR1 and CKFB1 as discussed above with respect to FIG. 1. The VCO circuit in circuits 301 may also generate other oscillating periodic signals. Periodic signal PLC1 is provided to a first multiplexing input of multiplexer circuit 307 and to inputs of frequency divider circuits 302-303. Frequency divider circuit 302 divides the frequency of periodic signal PLC1 by a frequency division value A to generate the frequency of a divided clock signal CKD1. Clock signal CKD1 is provided to a second multiplexing input of multiplexer circuit 307 and to an input of frequency divider circuit 304. Frequency divider circuit 304 divides the frequency of clock signal CKD1 by a frequency division value M1 to generate the frequency of feedback clock signal CKFB1. Thus, M1 equals the frequency of CKD1 divided by the frequency of CKFB1. Frequency divider circuit 304 functions as the feedback frequency divider circuit 105 in FIG. 1. The feedback clock signal CKFB1 is provided to circuits 301 and to sigma-delta modulator circuit 306.

Sigma-delta modulator circuit 306 generates control signals MDIV based on input control signals FCW. Control signals MDIV are provided to inputs of frequency divider circuit 304. The binary value of control signals MDIV determines the frequency division value M1 of frequency divider circuit 304. Sigma-delta modulator circuit 306 can continuously vary the binary value of control signals MDIV between two or more different binary values using a dithering technique during the operation of PLL circuit 310 in response to clock signal CKFB1. Frequency divider circuit 304 changes the frequency division value M1 used to generate the frequency of clock signal CKFB1 between 2 or more values in response to the variations in the binary value of control signals MDIV. As a result, PLL circuit 310 generates a fractional frequency in periodic signal PLC1 relative to the frequency of clock signal CKR1. By changing the frequency division value M1 used to generate clock signal CKFB1 between 2 or more different numbers, PLL circuit 310 can cause periodic signal PLC1 to have an average frequency that equals the frequency of clock signal CKR1 times a fractional, non-integer number. Thus, sigma-delta modulator circuit 306 can cause PLL circuit 310 to function as a fractional PLL circuit that causes the frequency of periodic signal PLC1 divided by the frequency of clock signal CKR1 to equal a positive fractional non-integer number. Further details of an exemplary fractional PLL circuit that can be used to implement corresponding portions of PLL circuit 310 are disclosed with respect to FIGS. 6-8 of commonly-assigned U.S. Pat. No. 8,537,956, issued Sep. 17, 2013, which is incorporated by reference herein in its entirety. Sigma-delta modulator circuit 306 may also be configured to maintain the binary value of signals MDIV constant during the operation of PLL circuit 310 to cause the frequency of periodic signal PLC1 divided by the frequency of clock signal CKR1 to equal an integer number.

Frequency divider circuit 303 divides the frequency of periodic signal PLC1 by a frequency division value B to generate the frequency of clock signal CKD2. Clock signal CKD2 may, for example, be provided to one of the data channel circuits 201 as an additional clock signal. Multiplexer circuit 307 generates a selected clock signal CKS based on periodic signal PLC1 or based on clock signal CKD1 in response to the value of select signal 51 at the select input of multiplexer circuit 307. The value of digital select signal 51 determines whether multiplexer circuit 307 provides the waveform of periodic signal PLC1 or the waveform of clock signal CKD1 as clock signal CKS. Frequency divider circuit 305 divides the frequency of clock signal CKS by a frequency division value L1 to generate the frequency of an output clock signal CKD3 of PLL circuit 310. Thus, L1 equals the frequency of CKS divided by the frequency of CKD3.

The output clock signal CKD3 of PLL circuit 310 is provided to a first multiplexing input of multiplexer circuit 317 in PLL circuit 320. A clock signal CKW is provided to a second multiplexing input of multiplexer circuit 317. Multiplexer circuit 317 generates a selected reference clock signal CKR2 based on clock signal CKD3 in response to select signal S2 having a first value. Multiplexer circuit 317 generates clock signal CKR2 based on clock signal CKW in response to select signal S2 having a second value. The value of digital select signal S2 determines whether multiplexer circuit 317 provides the waveform of clock signal CKD3 or the waveform of clock signal CKW as clock signal CKR2. In the embodiment disclosed with respect to FIG. 3, multiplexer circuit 317 generates clock signal CKR2 based on clock signal CKD3.

Clock signal CKR2 is provided to a first input of PFD circuit 101 in circuits 311 as a reference clock signal. A feedback clock signal CKFB2 is provided to a second input of PFD circuit 101 in circuits 311. The ring oscillator circuit 104 in circuits 311 generates an oscillating periodic signal PLC2 (e.g., one of signals OPS in FIG. 1) based on the phase and/or frequency differences between clock signals CKR2 and CKFB2 as discussed above with respect to FIG. 1. Periodic signal PLC2 is provided to an input of frequency divider circuit 313. Frequency divider circuit 313 divides the frequency of periodic signal PLC2 by a frequency division value C (e.g., 2) to generate the frequency of a divided clock signal CKD4. Thus, C equals the frequency of PLC2 divided by the frequency of CKD4. Clock signal CKD4 is provided to inputs of frequency divider circuits 314 and 315. Frequency divider circuit 314 divides the frequency of clock signal CKD4 by a frequency division value M2 to generate the frequency of feedback clock signal CKFB2. Thus, M2 equals the frequency of CKD4 divided by the frequency of CKFB2. Frequency divider circuit 314 functions as the feedback frequency divider 105 shown in FIG. 1. Frequency divider circuit 315 divides the frequency of clock signal CKD4 by a frequency division value L2 to generate the frequency of an output clock signal CLKCH of PLL circuit 320. Thus, L2 equals the frequency of CKD4 divided by the frequency of CLKCH.

Each of the four clock signals CLKCH1, CLKCH2, CLKCH3, and CLKCH4 of FIG. 2 corresponds to the clock signal CLKCH generated by the PLL circuit 320 in the respective one of circuits 230A-230D. Each of the data channel circuits 201 of FIG. 2 can generate a respective output data signal (e.g., DSO1-DSO4) in response to the clock signal CLKCH generated by the PLL circuit 320 in the respective one of clock signal generation circuits 230.

In some embodiments, the LC tank oscillator circuit 104 in the PLL circuit 310 in each clock signal generation circuit 230/300 generates a frequency range in each of its internally generated oscillating periodic signals, including signal PLC1, that does not overlap with any of the frequency ranges of the oscillating periodic signals PLC1 that are internally generated by nearby LC tank oscillator circuits. The LC tank oscillator circuit 104 in each PLL circuit 310 does not generate frequencies in periodic signal PLC1 (or in other internally generated periodic signals) that are outside the frequency range of that LC tank oscillator circuit. Thus, nearby LC tank oscillator circuits in PLL circuits 310 do not generate periodic signals PLC1 that are at the same frequency. As a result, the LC tank oscillator circuits in PLL circuits 310 generate significantly less EM cross-coupling in periodic signals PLC1, and the periodic signals PLC1 have low jitter. Nearby LC tank oscillator circuits may be, for example, LC tank oscillator circuits that are physically separated in the IC by a minimum distance or less than the minimum distance. The LC tank oscillator circuits that are physically separated in the IC by greater than the minimum distance can operate at the same frequency or in the same range of frequencies. The minimum distance may, for example, be the distance in the IC between a minimum number N (e.g., 6, 7, 8, 9, or 10) of the LC tank oscillator circuits. In some embodiments, the frequency ranges of the periodic signals PLC1 generated by LC tank oscillator circuits in nearby PLL circuits 310 are separated by non-zero values that significantly reduce or completely avoid EM coupling.

According to another aspect of these embodiments, the PLL circuit 320 in each clock signal generation circuit 230/300 generates a frequency in clock signal CLKCH (e.g., one of clock signals CLKCH1-CLKCH4) that is the same as or substantially the same as the frequencies of the output clock signals CLKCH of the PLL circuits 320 in the other clock signal generation circuits 230/300 (e.g., the other three of clock signals CLKCH1-CLKCH4). As specific examples that are not intended to be limiting, the periods of clock signals CLKCH1-CLKCH4 may differ from each other by no more than 10 or 100 parts per million. By generating clock signals CLKCH1-CLKCH4 that have the same frequency or nearly the same frequencies, the transmitter circuits 211 in data channel circuits 201 can transmit data signals at nearly identical data rates at the same time.

By generating periodic signals PLC1 in nearby clock signal generation circuits 230/300 that have non-overlapping frequency ranges as discussed above, clock signals CLKCH1-CLKCH4 can have the same frequency or nearly the same frequencies, without generating significant EM cross-coupling and jitter in clock signals CLKCH1-CLKCH4. The LC tank oscillator circuits 104 in the PLL circuits 310 in the clock signal generation circuits 230/300 generate significantly less EM cross-coupling and jitter in periodic signals PLC1, because the frequency ranges of periodic signals PLC1 do not overlap in nearby ones of clock signal generation circuits 230/300. Also, the frequency ranges of periodic signals PLC1 in nearby PLL circuits 310 may be separated by non-zero values. In addition, the ring oscillator circuits 104 in PLL circuits 320 in the clock signal generation circuits 230/300 do not generate significant phase noise or phase jitter in clock signals CLKCH, because each clock signal CLKCH is generated in response to a low phase jitter, low phase noise periodic signal PLC1 generated in the respective PLL circuit 310.

A specific example of the embodiment described above is shown in Table 1 below. According to this specific example, IC 200 has 12 data channel circuits 201 and 12 respective clock signal generation circuits 230. The 12 data channel circuits 201 are grouped into two adjacent sets of 6 data channel circuits. The 6 different data channel circuits 201 in each of the two sets are referred to as CH0-CH5 in Table 1. The 12 clock signal generation circuits 230 are grouped into two adjacent sets of 6 clock signal generation circuits each. The 6 clock signal generation circuits 230 in each set are arranged in a row or column in the IC as shown, e.g., in FIG. 2. The 6 different PLL circuits 310 in the 6 different clock signal generation circuits 230 in each of the two sets are referred to as PLL circuits ATX0-ATX5 in Table 1. The 6 LC tank oscillator circuits 104 in the 6 PLL circuits 310 (ATX0-ATX5) in the 6 clock signal generation circuits 230 in each of the two sets generate non-overlapping frequency ranges in their respective periodic signals PLC1 as shown in Table 1. The LC tank oscillator circuits 104 in the PLL circuits 310 cannot generate frequencies in their periodic signals PLC1 that are outside the respective frequency ranges shown in Table 1 in this example.

TABLE 1

| Data Channel Circuit | PLL 310 (LC Tank Oscillator) | Frequency Range For Periodic Signal PLC1 in MHz | |
|---|---|---|---|
| | | Lowest Frequency | Highest Frequency |
| CH5 | ATX5 | 7,200 | 7,650 |
| CH4 | ATX4 | 7,750 | 8,350 |
| CH3 | ATX3 | 8,450 | 9,050 |
| CH2 | ATX2 | 9,150 | 9,750 |
| CH1 | ATX1 | 9,850 | 12,500 |
| CH0 | ATX0 | 12,600 | 14,000 |
| CH5 | ATX5 | 7,200 | 7,650 |
| CH4 | ATX4 | 7,750 | 8,350 |
| CH3 | ATX3 | 8,450 | 9,050 |
| CH2 | ATX2 | 9,150 | 9,750 |
| CH1 | ATX1 | 9,850 | 12,500 |
| CH0 | ATX0 | 12,600 | 14,000 |

In the example of Table 1, each LC tank oscillator circuit 104 in each PLL circuit 310 (except the LC tank oscillator for CH5) generates a frequency range in its periodic signal PLC1 having a minimum frequency that is 100 megahertz (MHz) greater than the maximum frequency generated by an LC tank oscillator 104 in an adjacent PLL circuit 310. Each LC tank oscillator circuit 104 in each PLL circuit 310 (except the LC tank oscillator for CH0) generates a maximum frequency for the frequency range of its periodic signal PLC1 that is 100 MHz less than the minimum frequency generated by an LC tank oscillator 104 in another adjacent PLL circuit 310. The 100 MHz separation between the frequency ranges in Table 1 is merely one example. In other embodiments, the separation between the frequency ranges of periodic signals PLC1 in nearby PLL circuits 310 may be any frequency value equal to or greater than 0. In some embodiments, if an arbitrary number M of data channels are placed next to each other (e.g., M=12 data channels in Table 1), none of the data channels couple with each other, because all of the data channels and PLLs are separated by a minimum distance N of M/2 (e.g., N=M/2=6) from any other PLL 310 running at the same frequency for PLC1. A minimum distance of 6 is just an example that is not intended to be limiting. Other exemplary minimum distances N between PLL circuits 310 are 7, 8, 9, or 10 PLL circuits 310. Each LC tank oscillator circuit 104 in each PLL circuit 310 does not need to support a wide frequency range. Instead, the frequency range that each LC tank oscillator circuit 104 provides in its internally generated periodic signal PLC1 may be relatively narrow, as shown for example in Table 1.

The frequency division value M1 of frequency divider circuit 304 is selected to achieve the frequency ranges shown in Table 1 for the periodic signals PLC1 in the PLL circuits 310 (ATX0-ATX5) in each set of the 6 clock signal generation circuits 230/300. For example, the frequency division value M1 may be a number between 8 and 127. As a more specific example, if M1=PLC1/CKR1, CH5 functions at PLC1=7400 MHz, and CKR1=250 MHz, then M1=29.6, A=1, and signals FCW=0.6.

Table 2 below shows examples of the frequency division values L1, M2, and L2 of frequency divider circuits 305, 314, and 315, respectively. Table 2 also shows examples of frequencies of periodic signals PLC1 and CKD3/CKR2 in MHz and example frequencies of clock signal CLKCH in gigahertz (GHz) that may be generated using the frequency division values for L1, M2, and L2 shown in the respective rows.

TABLE 2

| Data Channel Circuit | Frequency of Periodic Signal PLC1 (MHz) | L1 | Frequency of Clock Signal CKD3 and CKR2 (MHz) | M2 | L2 | Frequency of Clock signal CLKCH (GHz) |
|---|---|---|---|---|---|---|
| CH5 | 7448 | 13 | 573 | 18 | 1 | 10.3125 |
| CH4 | 8020 | 14 | 573 | 18 | 1 | 10.3125 |
| CH3 | 8594 | 15 | 573 | 18 | 1 | 10.3125 |
| CH2 | 9167 | 16 | 573 | 18 | 1 | 10.3125 |
| CH1 | 11458 | 20 | 573 | 18 | 1 | 10.3125 |
| CH0 | 13535 | 20 | 644.53 | 16 | 1 | 10.3125 |

Multiplexer circuit 317 generates CKR2 based on CKD3 in the example of Table 2 to cause clock signals CKR2 and CKD3 to have the same frequency. As shown in the rightmost column of Table 2, the frequency division values can be chosen to generate the identical frequency (about 10.3 GHz) in the output clock signal CLKCH of each of the ring oscillator PLLs 320 for channels CH0-CH5. In the example of Table 2, a different output frequency is generated in the clock signal CKD3 for channel CH0 compared to the frequencies generated in the clock signals CKD3 for channels CH1-CH5, while the ring oscillator PLL circuits 320 for all 6 channels CH0-CH5 generate the same frequency in their output clock signals CLKCH. Thus, the PLL circuits 310 for channels CH0-CH5 can generate different frequencies in their output clock signals CKD3, and at the same time, the PLLs 320 for channels CH0-CH5 can generate the same frequency in each of their 6 output clock signals CLKCH, providing increased flexibility to the configuration of the PLLs.

Because the frequencies of the 6 clock signals CLKCH for the 6 data channel circuits CH0-CH5 are the same in the example of Table 2, the data channel circuits CH0-CH5 can generate the same data rate (or nearly the same data rates) in their output data signals. For example, the data channel circuits CH0-CH5 may generate data rates in their output data signals that differ from each other by a few hundred parts per million (PPM) or less than 1 unit interval (UI) of a data bit in each output data signal. According to another example, the clock signal generation circuits 230/300 for multiple data channel circuits 201 may generate a clock signal frequency of 5 GHz for CLKCH.

Figure 4:
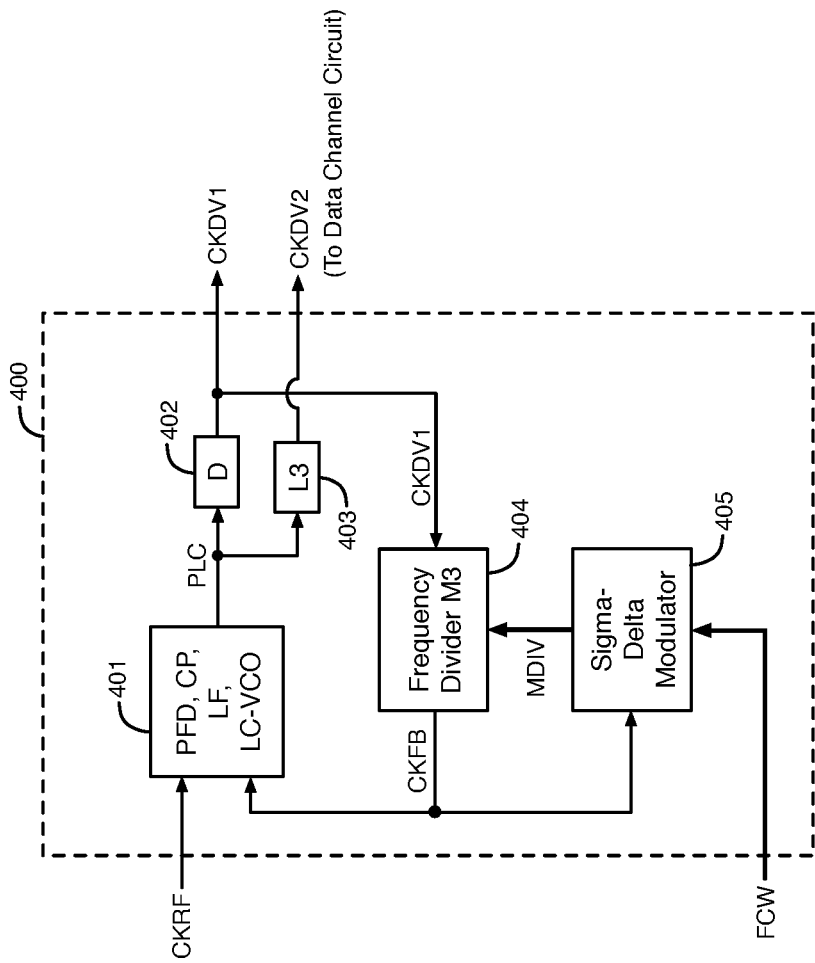
FIG. 4 illustrates an example of a phase-locked loop circuit, according to another embodiment.

FIG. 4 illustrates an example of a phase-locked loop (PLL) circuit 400, according to another embodiment. PLL circuit 400 shown in FIG. 4 is an example of each of the clock signal generation circuits 230A-230D of FIG. 2. In an embodiment, each of the clock signal generation circuits 230A-230D of FIG. 2 includes an instance of PLL circuit 400.

PLL circuit 400 includes circuits 401, frequency divider circuits 402-404, and sigma-delta modulator circuit 405. Circuitry 150 shown in FIG. 1 is an example of circuits 401. In this example, circuits 401 include a phase frequency detector (PFD) circuit 101, a charge pump (CP) circuit 102, a loop filter (LF) circuit 103, and a voltage-controlled oscillator (VCO) circuit 104 that are coupled as shown in FIG. 1. In this example, VCO circuit 104 in circuits 401 is an inductor-capacitor (LC) tank oscillator circuit.

A reference clock signal CKRF is provided to a first input of PFD circuit 101 in circuits 401, and a feedback clock signal CKFB is provided to a second input of PFD circuit 101 in circuits 401. The LC tank VCO circuit 104 in circuits 401 generates an oscillating periodic signal PLC (e.g., one of signals OPS) based on the phase and/or frequency differences between the reference and feedback clock signals CKRF and CKFB as discussed above with respect to FIG. 1. The VCO circuit 104 in circuits 401 may also generate other oscillating periodic signals.

Periodic signal PLC is provided to an input of each of the frequency divider circuits 402-403. Frequency divider circuit 402 divides the frequency of periodic signal PLC by a frequency division value D (e.g., D equals 2) to generate the frequency of a first divided clock signal CKDV1. Thus, the frequency of PLC divided by the frequency of CKDV1 equals D. Frequency divider circuit 403 divides the frequency of periodic signal PLC by a frequency division value L3 to generate the frequency of a second divided clock signal CKDV2, which is provided to a data channel circuit. Thus, the frequency of PLC divided by the frequency of CKDV2 equals L3.

The first divided clock signal CKDV1 is provided to an input of frequency divider circuit 404. Frequency divider circuit 404 divides the frequency of clock signal CKDV1 by a frequency division value M3 to generate the frequency of feedback clock signal CKFB. Thus, M3 equals the frequency of CKDV1 divided by the frequency of CKFB. Frequency divider circuit 404 functions as the feedback frequency divider circuit 105 of FIG. 1. The feedback clock signal CKFB is provided to circuits 401 and to sigma-delta modulator circuit 405.

Sigma-delta modulator circuit 405 generates control signals MDIV based on input control signals FCW. Control signals MDIV are provided to inputs of frequency divider circuit 404. The binary value of control signals MDIV determines the frequency division value M3 of frequency divider circuit 404. Sigma-delta modulator circuit 405 can continuously vary the binary value of control signals MDIV between two or more different binary values using a dithering technique during the operation of PLL circuit 400 in response to clock signal CKFB. Frequency divider circuit 404 changes the frequency division value M3 used to generate the frequency of clock signal CKFB between 2 or more values in response to the variations of the binary value of control signals MDIV. As a result, PLL circuit 400 can generate fractional frequencies in clock signals CKDV1-CKDV2 relative to the frequency of clock signal CKRF. PLL circuit 400 can cause each of clock signals CKDV1-CKDV2 to have an average frequency that equals the frequency of clock signal CKRF times a fractional, non-integer number. Further details of an exemplary fractional PLL circuit that can be used to implement corresponding portions of PLL circuit 400 are disclosed with respect to FIGS. 6-8 of U.S. Pat. No. 8,537,956. Sigma-delta modulator circuit 405 may also be configured in a non-fractional mode to maintain the binary value of signals MDIV constant during the operation of PLL circuit 400 to cause the frequency of each of clock signals CKDV1-CKDV2 divided by the frequency of clock signal CKRF to equal an integer number.

In an embodiment, each of the four clock signals CLKCH1, CLKCH2, CLKCH3, and CLKCH4 of FIG. 2 is the clock signal CKDV2 generated by the PLL circuit 400 in the respective one of clock signal generation circuits 230A-230D. Each of the data channel circuits 201 of FIG. 2 can generate a respective output data signal (e.g., DSO1-DSO4) in response to the clock signal CKDV2 generated by the PLL circuit 400 in the respective one of clock signal generation circuits 230.

In an embodiment, the LC tank oscillator circuit 104 in the PLL circuit 400 in each clock signal generation circuit 230 generates a frequency range in oscillating periodic signal PLC (and in its other internally generated periodic signals) that does not overlap with any of the frequency ranges of the oscillating periodic signals PLC that are internally generated by the nearby LC tank oscillator circuits 104. In this embodiment, the LC tank oscillator circuit 104 in each PLL circuit 400 does not generate frequencies in periodic signal PLC (or in its other internally generated periodic signals) that are outside the frequency range of that LC tank oscillator circuit. Thus, nearby LC tank oscillator circuits in PLL circuits 400 that are separated by no more than a minimum distance in the IC do not generate internal periodic signals PLC that are at the same frequency. As a result, the LC tank oscillator circuits 104 in PLL circuits 400 generate significantly less EM coupling in periodic signals PLC, and the periodic signals PLC have low jitter. The LC tank oscillator circuits 104 in PLL circuits 400 that are physically separated by greater than the minimum distance (i.e., are not nearby) can operate at the same frequency or in the same range of frequencies. The minimum distance may, for example, be the distance in the IC between a minimum number N (e.g., 6, 7, 8, 9, or 10) of the LC tank oscillator circuits 104 in PLL circuits 400.

According to another aspect of this embodiment, the PLL circuit 400 in each clock signal generation circuit 230 generates a frequency in clock signal CKDV2 (e.g., one of clock signals CLKCH1-CLKCH4) that is the same as or nearly the same as the frequencies of the output clock signals CKDV2 of the PLL circuits 400 in the other clock signal generation circuits 230. Using clock signals CLKCH1-CLKCH4 that have nearly the same frequencies, the transmitter circuits 211 in the data channel circuits 201 can concurrently transmit data signals at the same data rate or nearly the same data rates.

By generating periodic signals PLC in nearby clock signal generation circuits 230/400 that have non-overlapping frequency ranges as discussed above, clock signals CKDV2/CLKCH1-CLKCH4 can have the same frequency or nearly the same frequencies, without generating significant EM cross-coupling and jitter in clock signals CKDV2/CLKCH1-CLKCH4. The LC tank oscillator circuit 104 in each clock signal generation circuit 230/400 generates significantly less EM cross-coupling and jitter in its periodic signal PLC, because the frequency ranges of periodic signals PLC do not overlap in nearby ones of clock signal generation circuits 230/400.

Table 3 below shows examples of the frequency division value L3 of frequency divider circuit 403 in 5 PLL circuits 400 for 5 data channel circuits CH0-CH4. Table 3 also shows examples of the frequencies of periodic signals PLC and CKDV2 that the PLL circuits 400 can generate using the frequency division values for L3 shown in the respective rows.

TABLE 3

| For Data Channel Circuit | Frequency of Periodic Signal PLC (GHz) | Frequency Division Value L3 | Frequency of Clock Signal CKDV2 (GHz) |
|---|---|---|---|
| CH4 | 7.5 | 5 | 1.5 |
| CH3 | 9.0 | 6 | 1.5 |
| CH2 | 10.5 | 7 | 1.5 |
| CH1 | 12.0 | 8 | 1.5 |
| CH0 | 13.5 | 9 | 1.5 |

According to a specific example, the frequency division value L3 of frequency divider circuit 403 may be programmable by controls signals (not shown) to any one of several integer values (e.g., 3, 4, 5, 6, 7, 8, or 9) to generate the frequencies shown in Table 3. The frequency division value M3 of frequency divider circuit 404 may be controlled by sigma-delta modulator circuit 405 or held at a fixed integer number, as discussed above, depending on the frequency of CKRF and the desired frequency for CKDV2. As a specific example, frequency division value M3 may be selected to be in the range from 8 to 127. In the example of Table 3, each of the PLL circuits 400 generates a frequency of about 1.5 GHz in CKDV2.

According to other embodiments, the frequency divider circuits 403 in 3 or more PLL circuits 400 that provide clock signals CKDV2 to the data channel circuits 201 may use 2 frequency division values. In the example shown in Table 4 below, L3 alternates between 6 and 8 in the PLL circuits 400 for every other data channel circuit 201 from CH0 to CH3.

TABLE 4

| For Data Channel Circuit | Frequency of Periodic Signal PLC (GHz) | Frequency Division Value L3 | Frequency of Clock Signal CKDV2 (GHz) |
|---|---|---|---|
| CH3 | 9.0 | 6 | 1.5 |
| CH2 | 12.0 | 8 | 1.5 |
| CH1 | 9.0 | 6 | 1.5 |
| CH0 | 12.0 | 8 | 1.5 |

According to another example not shown in Tables 3-4, L3 alternates between values of 3 and 4 in the PLL circuits 400 for every other data channel circuit 201 (e.g., for 6 gigabit per second SDI). The technique of alternating the frequency division value L3 for every other data channel circuit 201 may be used for any number of data channel circuits 201, e.g., 3, 4, 5, 6, or more data channel circuits.

Figure 5:
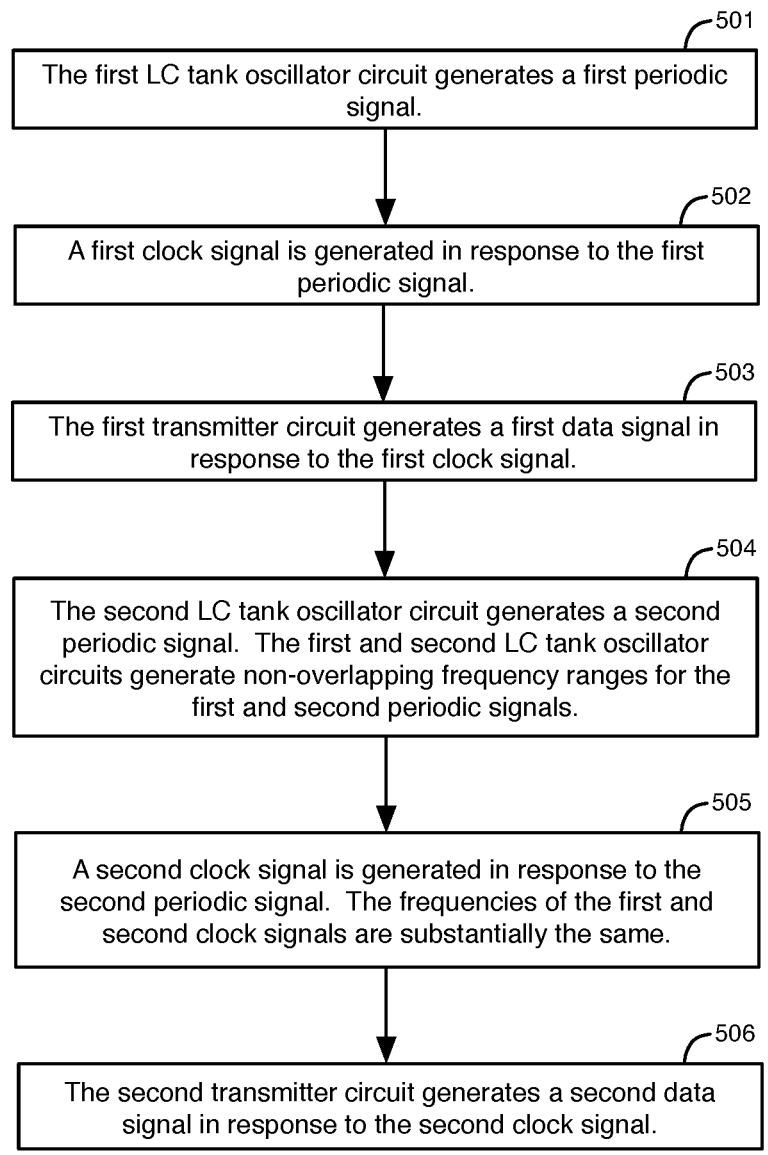
FIG. 5 is a flow chart that shows examples of operations that may be performed to reduce electro-magnetic cross-coupling and jitter in clock signals.

FIG. 5 is a flow chart that shows examples of operations 501-506 that may be performed to reduce EM cross-coupling and jitter in output clock signals, according to an embodiment. The frequencies of the output clock signals are the same or nearly the same, as described below in operation 505. In some embodiments, an integrated circuit includes first and second transmitter circuits and first and second inductor-capacitor (LC) tank oscillator circuits as disclosed herein, for example, with respect to FIGS. 1-4. In operation 501, the first LC tank oscillator circuit generates a first periodic signal. In operation 502, a first clock signal is generated in response to the first periodic signal. In operation 503, the first transmitter circuit generates a first data signal in response to the first clock signal. In operation 504, the second LC tank oscillator circuit generates a second periodic signal. The first and second LC tank oscillator circuits generate non-overlapping frequency ranges for the first and second periodic signals. In operation 505, a second clock signal is generated in response to the second periodic signal. The frequencies of the first and second clock signals are substantially the same. In operation 506, the second transmitter circuit generates a second data signal in response to the second clock signal. Operations 502 and 505 may, for example, be performed by frequency divider circuit 305 and PLL circuit 320 in two of circuits 230 for the embodiment of FIG. 3. As another example, operations 502 and 505 may be performed by frequency divider circuit 403 (shown in FIG. 4) in two of circuits 230.

The methods and apparatuses described herein may be incorporated into any suitable electronic device or system of electronic devices. For example, the methods and apparatuses may be incorporated into numerous types of devices such as integrated circuits (ICs). Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), graphics processing units (GPUs), and microprocessors, just to name a few.

The integrated circuits described herein may be part of a data processing system that includes one or more of the following components: a processor; memory; input/output circuitry; and peripheral devices. The integrated circuits can be used in a wide variety of applications, such as computer networking, data networking, instrumentation, video processing, digital signal processing, or any suitable other application.

Although the method operations were described in a specific order, it should be understood that other operations may be performed in between described operations, described operations may be adjusted so that they occur at slightly different times or described operations may be distributed in a system that allows the occurrence of the processing operations at various intervals associated with the processing.

The foregoing description of the exemplary embodiments of the present invention has been presented for the purpose of illustration of examples. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit comprising:
   a first data channel circuit to generate a first data signal in response to a first clock signal;
   a second data channel circuit to generate a second data signal in response to a second clock signal, wherein frequencies of the first and second clock signals are substantially the same;
   a first inductor-capacitor (LC) tank oscillator circuit to generate a first periodic signal; and
   a second LC tank oscillator circuit to generate a second periodic signal, wherein the first and second LC tank oscillator circuits generate non-overlapping frequency ranges for the first and second periodic signals;
   a first phase-locked loop circuit comprising a first ring oscillator circuit, wherein the first phase-locked loop circuit generates the first clock signal in response to the first periodic signal; and
   a second phase-locked loop circuit comprising a second ring oscillator circuit, wherein the second phase-locked loop circuit generates the second clock signal in response to the second periodic signal.

2. The integrated circuit of claim 1, wherein the first data channel circuit comprises a first receiver circuit that generates the first data signal in response to the first clock signal, and wherein the second data channel circuit comprises a second receiver circuit that generates the second data signal in response to the second clock signal.

3. The integrated circuit of claim 1 further comprising:
   a third phase-locked loop circuit comprising the first LC tank oscillator circuit, wherein the third phase-locked loop circuit generates a third clock signal in response to the first periodic signal, and wherein the first phase-locked loop circuit generates the first clock signal in response to the third clock signal; and
   a fourth phase-locked loop circuit comprising the second LC tank oscillator circuit, wherein the fourth phase-locked loop circuit generates a fourth clock signal in response to the second periodic signal, and wherein the second phase-locked loop circuit generates the second clock signal in response to the fourth clock signal.

4. The integrated circuit of claim 3 further comprising:
   a plurality of additional data channel circuits, wherein one of the plurality of additional data channel circuits generates a third data signal in response to a fifth clock signal;
   a fifth phase-locked loop circuit comprising a third LC tank oscillator circuit that generates a third periodic signal; and
   a sixth phase-locked loop circuit comprising a third ring oscillator circuit, wherein the sixth phase-locked loop circuit generates the fifth clock signal in response to the third periodic signal, and wherein the first, second, and third LC tank oscillator circuits generate non-overlapping frequency ranges for the first, second, and third periodic signals.

5. The integrated circuit of claim 3, wherein the third phase-locked loop circuit comprises a first sigma-delta modulator circuit that causes the third phase-locked loop circuit to generate a fractional non-integer frequency in the third clock signal relative to a first input reference clock signal to the third phase-locked loop circuit, and wherein the fourth phase-locked loop circuit comprises a second sigma-delta modulator circuit that causes the fourth phase-locked loop circuit to generate a fractional non-integer frequency in the fourth clock signal relative to a second input reference clock signal to the fourth phase-locked loop circuit.

6. An integrated circuit comprising:
   a first data channel circuit to generate a first data signal in response to a first clock signal;
   a second data channel circuit to generate a second data signal in response to a second clock signal, wherein frequencies of the first and second clock signals are substantially the same;
   a first inductor-capacitor (LC) tank oscillator circuit to generate a first periodic signal, wherein the first clock signal is generated in response to the first periodic signal; and
   a second LC tank oscillator circuit to generate a second periodic signal, wherein the second clock signal is generated in response to the second periodic signal, and wherein the first and second LC tank oscillator circuits generate non-overlapping frequency ranges for the first and second periodic signals,
   wherein the first data channel circuit comprises a first receiver circuit that generates the first data signal in response to the first clock signal, and wherein the second data channel circuit comprises a second receiver circuit that generates the second data signal in response to the second clock signal.

7. The integrated circuit of claim 1, wherein the first LC tank oscillator circuit causes the frequency range of the first periodic signal to be separated by a frequency value that is greater than zero from the frequency range of the second periodic signal generated by the second LC tank oscillator circuit.

8. The integrated circuit of claim 1, wherein the first data channel circuit comprises a first transmitter circuit that generates the first data signal in response to the first clock signal, and wherein the second data channel circuit comprises a second transmitter circuit that generates the second data signal in response to the second clock signal.

9. The integrated circuit of claim 6 further comprising:
   a first phase-locked loop circuit comprising the first LC tank oscillator circuit and a first frequency divider circuit that generates the first clock signal in response to the first periodic signal; and
   a second phase-locked loop circuit comprising the second LC tank oscillator circuit and a second frequency divider circuit that generates the second clock signal in response to the second periodic signal.

10. The integrated circuit of claim 1, wherein the first data channel circuit is next to the second data channel circuit in the integrated circuit.

11. An integrated circuit comprising:
a first data channel circuit to generate a first data signal in response to a first clock signal;
a second data channel circuit to generate a second data signal in response to a second clock signal, wherein frequencies of the first and second clock signals are substantially the same;
a first phase-locked loop circuit comprising a first inductor-capacitor (LC) tank oscillator circuit that generates a first periodic signal;
a second phase-locked loop circuit to generate the first clock signal in response to the first periodic signal;
a third phase-locked loop circuit comprising a second LC tank oscillator circuit that generates a second periodic signal; and
a fourth phase-locked loop circuit to generate the second clock signal in response to the second periodic signal, wherein the first and second LC tank oscillator circuits generate non-overlapping frequency ranges for the first and second periodic signals.

12. The integrated circuit of claim 11, wherein the first phase-locked loop circuit further comprises a first frequency divider circuit to generate a third clock signal in response to the first periodic signal, wherein the second phase-locked loop circuit generates the first clock signal in response to the third clock signal, wherein the third phase-locked loop circuit further comprises a second frequency divider circuit to generate a fourth clock signal in response to the second periodic signal, and wherein the fourth phase-locked loop circuit generates the second clock signal in response to the fourth clock signal.

13. The integrated circuit of claim 11, wherein the second phase-locked loop circuit comprises a first ring oscillator circuit, and wherein the fourth phase-locked loop circuit comprises a second ring oscillator circuit.

14. The integrated circuit of claim 11, wherein the first data channel circuit is adjacent to the second data channel circuit in the integrated circuit.

15. The integrated circuit of claim 14, wherein the first data channel circuit comprises a first transmitter circuit that generates the first data signal in response to the first clock signal, and wherein the second data channel circuit comprises a second transmitter circuit that generates the second data signal in response to the second clock signal.

16. A method comprising:
generating a first periodic signal with a first inductor-capacitor (LC) tank oscillator circuit;
generating a first clock signal in response to the first periodic signal with a first phase-locked loop circuit that comprises a first ring oscillator circuit;
generating a first data signal in response to the first clock signal with a first transmitter circuit;
generating a second periodic signal with a second LC tank oscillator circuit, wherein the first and second LC tank oscillator circuits generate non-overlapping frequency ranges in the first and second periodic signals;
generating a second clock signal in response to the second periodic signal with a second phase-locked loop circuit that comprises a second ring oscillator circuit; and
generating a second data signal in response to the second clock signal with a second transmitter circuit, wherein frequencies of the first and second clock signals are substantially the same.

17. The method of claim 16 further comprising:
generating a third clock signal in response to the first periodic signal with a third phase-locked loop circuit that comprises the first LC tank oscillator circuit, and wherein the first phase-locked loop circuit generates the first clock signal in response to the third clock signal; and
generating a fourth clock signal in response to the second periodic signal with a fourth phase-locked loop circuit that comprises the second LC tank oscillator circuit, wherein the second phase-locked loop circuit generates the second clock signal in response to the fourth clock signal.

18. The method of claim 17, wherein the third phase-locked loop circuit comprises a first sigma-delta modulator circuit, and wherein the fourth phase-locked loop circuit comprises a second sigma-delta modulator circuit.

19. The method of claim 16, wherein generating a first clock signal in response to the first periodic signal comprises generating the first clock signal in response to the first periodic signal with a first frequency divider circuit in the first phase-locked loop circuit, and
wherein generating a second clock signal in response to the second periodic signal comprises generating the second clock signal in response to the second periodic signal with a second frequency divider circuit in the second phase-locked loop circuit.

20. A method comprising:
generating a first periodic signal with a first inductor-capacitor (LC) tank oscillator circuit;
generating a first clock signal in response to the first periodic signal with a first phase-locked loop circuit;
generating a first data signal in response to the first clock signal with a first receiver circuit in a first data channel circuit;
generating a second periodic signal with a second LC tank oscillator circuit, wherein the first and second LC tank oscillator circuits generate non-overlapping frequency ranges in the first and second periodic signals;
generating a second clock signal in response to the second periodic signal with a second phase-locked loop circuit; and
generating a second data signal in response to the second clock signal with a second receiver circuit in a second data channel circuit, wherein frequencies of the first and second clock signals are substantially the same.

* * * * *